United States Patent [19]

Yamada

[11] Patent Number: 5,912,585
[45] Date of Patent: Jun. 15, 1999

[54] VACUUM TUBE AUDIO AMPLIFYING CIRCUIT

[75] Inventor: Kazutoshi Yamada, Sakai, Japan

[73] Assignee: Zanden Audio System Co., Ltd., Osaka Pref., Japan

[21] Appl. No.: 08/958,482

[22] Filed: Oct. 27, 1997

[51] Int. Cl.$^6$ ............... H03F 3/28; H03F 5/00; H03F 1/22
[52] U.S. Cl. ............... 330/118; 330/3; 330/150
[58] Field of Search .................... 330/118, 119, 330/120, 121, 122, 123, 3, 150

[56] References Cited

U.S. PATENT DOCUMENTS 2,257,782  10/1941  Boucke .................... 330/150
2,716,162  8/1955  Pearlman .................. 330/123

Primary Examiner—Robert Pascal
Assistant Examiner—Patricia Nguyen
Attorney, Agent, or Firm—McDermott, Will & Emery

[57] ABSTRACT

In a direct coupled type vacuum tube amplifying circuit, to stabilize the operation and simplify the feedback loop, a plate power source EB5 is connected to a plate of a vacuum tube V5 of a first stage through a constant current source 1. A grid of a vacuum tube V6 of a next stage is connected to the plate of the vacuum tube V5 through a first resistance R3. A second resistance R4 is connected between the grid and the cathode of the vacuum tube V6. A negative power source EC6 is connected to the resistance R4 through a constant current source 2. In this constitution, the grid bias voltage of the second vacuum tube V6 is defined by the voltage drop of the second resistance R4.

18 Claims, 7 Drawing Sheets

VACUUM TUBE AUDIO AMPLIFYING CIRCUIT

FIELD OF THE INVENTION

The present invention relates to a vacuum tube audio amplifying circuit, and more particularly to a vacuum tube amplifying circuit for audio frequency having stages of an amplifying circuit coupled directly to each other without using coupling capacitor.

PRIOR ART

FIG. 1 is a conventional circuit diagram showing a first example of a direct coupled audio amplifying circuit for sound using a vacuum tube. Vacuum tubes described below have a plate, a cathode and at least one grid located between the cathode and the plate. In the diagram, a vacuum tube V1 is a vacuum tube of a first stage. A cathode end of the vacuum tube V1 is grounded, and a plate power source EB1 is connected to a plate of the vacuum tube through a plate resistance Rp1. A coupling capacitor C1 is connected between the plate power source EB1 and the cathode. Alternating-current load resistances R1, R2 are connected in series to the plate of the vacuum tube V1, and the middle point thereof is connected to a grid of a vacuum tube V2 of a second stage. A negative power source EC2 is connected to the other end of the resistance R2. A cathode end of the vacuum tube V2 is grounded. A plate power source EB2 is a plate power source for the vacuum tube V2, and it is connected to the plate of the vacuum tube V2 through a load Z. Capacitors C2, C3 are capacitors for decoupling.

In such vacuum tube amplifying circuit, a grid bias voltage Eg2 of the vacuum tube V2 is given in formula (1) below, supposing the plate voltage of the vacuum tube v1 to be Ep1 and the voltage of the negative power source EC2 to be EC2.

$$Eg2 = \frac{Ep1 \cdot R2 - EC2 \cdot R1}{R1 + R2} \quad (1)$$

In such direct coupled amplifying circuit of the first prior art, if the voltage of the negative power source EC2 is fixed, the grid bias voltage Eg2 of the vacuum tube V2 is determined by the values of the plate voltage Ep1 of the vacuum tube V1 and the resistances R1, R2, as shown in formula (1). From the viewpoint of distortion factor characteristic, the plate resistance Rp1 cannot be decreased too much. However, if a large value is set for the plate resistance Rp1, the voltage drop of the plate resistance Rp1 becomes large, and hence it is required to heighten the output voltage of the power source EB1 for the corresponding portion. Moreover, even if the change is slight in the plate current of the vacuum tube V1, the change of the voltage at both ends of the plate resistance Rp1 becomes large, and the plate voltage Ep1 fluctuates, and the variation of the grid bias voltage Eg2 increases.

Incidentally, here are formed a loop of sound signal feeding back from the plate of the vacuum tube V1 to its cathode through resistance Rp1 and capacitor C1, and a loop of sound signal feeding back from the plate to the cathode through resistances R1, R2 by way of capacitor C2. Since these capacitors C1 and C2 are for decoupling purpose, and large in capacity, and a time constant is large, which is harmful for sound quality. Yet, since the alternating-current load of the vacuum tube V1 is a parallel combined impedance of two alternating-current signal loops, it has a defect of heavy load.

FIG. 2 is a circuit diagram showing a second example of a vacuum tube amplifying circuit of direct coupling type of a prior art. In the diagram, a cathode of a vacuum tube V3 of a first stage is grounded, and a plate power source EB 3 is connected to a plate through a plate resistance Rp3. A grid of a vacuum tube V4 of a second stage is directly connected to the plate of the vacuum tube V3. A plate power source EB4 is connected to a plate of the vacuum tube V4 through a load Z. A cathode end of the vacuum tube V4 is grounded through a resistance Rk4 for grid bias, and the grid bias of the vacuum tube V4 is determined. A capacitor C6 for bypass is connected in parallel to the resistance Rk4. Capacitors C5 and C7 are capacitors for decoupling. In this case, supposing the plate voltage of the vacuum tube V3 to be Ep3 and the cathode voltage of the vacuum tube V4 to be Ek4, the grid bias voltage Eg4 of the vacuum tube V4 is given in the following formula (2).

$$Eg4 = Ep3 - Ek4 \quad (2)$$

In the direct coupled amplifying circuit of this prior art, too, a loop of sound signal is formed from the plate of the vacuum tube V3 to the cathode through the resistance Rp3 and capacitor C5. A loop of sound signal is also formed from the plate of the vacuum tube V4 to its cathode through the load Z, and capacitors C7 and C6. These capacitors C5 and C7 are for decoupling and are hence large in capacity, and the bypass capacitor C6 connected between the cathode of the vacuum tube V4 and the grounding end must have large capacity and withstand voltage. And since it is placed in the feedback loop of an alternating-current signal, it was a defect because it was harmful for the sound quality.

SUMMARY OF THE INVENTION

The invention is devised in the light of the above problems of the prior arts, and it is an object thereof to stabilize the motion of directly coupling by using a constant current circuit, separate into a direct-current load and an alternating-current load, unify the feedback loop of sound signal, and enhance the sound quality so that no capacitor should be placed in the feedback loop.

According to the invention, by a first constant current circuit, a plate current is supplied into a vacuum tube of a first stage, and a plate voltage is determined. From this plate, a current flows into a second resistance side through a first resistance, and simultaneously a current flows into the second resistance in its reverse direction by a second constant current circuit. Therefore, by the potential difference at both ends of the second resistance, the grid bias voltage of a vacuum tube of a second stage is determined. At this time, by the first constant current circuit, fluctuations of the plate voltage of the vacuum tube of the first stage are decreased, and no capacitor is present in the feedback loop of sound signal, and therefore the low range sound quality, and frequency and phase characteristics may be enhanced notably.

DESCRIPTION OF THE PREFERRED EMBODIMENTS

A vacuum tube amplifying circuit of the invention comprises a vacuum tube of a first stage for receiving a sound input signal at its grid, a vacuum tube of a second stage for amplifying the amplified output of the vacuum tube of the first stage, a first positive voltage source, a first constant current circuit connected between an output end of the first positive voltage source and a plate of the vacuum tube of the first stage for feeding a constant current, a first resistance connected between the plate of the vacuum tube of the first stage and a grid of the vacuum tube of the second stage, a negative voltage source for feeding a negative voltage to the grid of the vacuum tube of the second stage, a second constant current circuit connected between an output end of the negative voltage source and the grid of the vacuum tube of the second stage for feeding a constant current, a second resistance connected between the grid and cathode of the vacuum tube of the second stage, and a second positive voltage source connected to a plate of the vacuum tube of the second stage through a load, wherein the grid bias voltage of the vacuum tube of the second stage is set by a voltage drop obtained at both ends of the second resistance, on the basis of the shunt current of the first constant current circuit flowing in the second resistance, and the current of the second constant current circuit

EMBODIMENT 1

Figure 1:
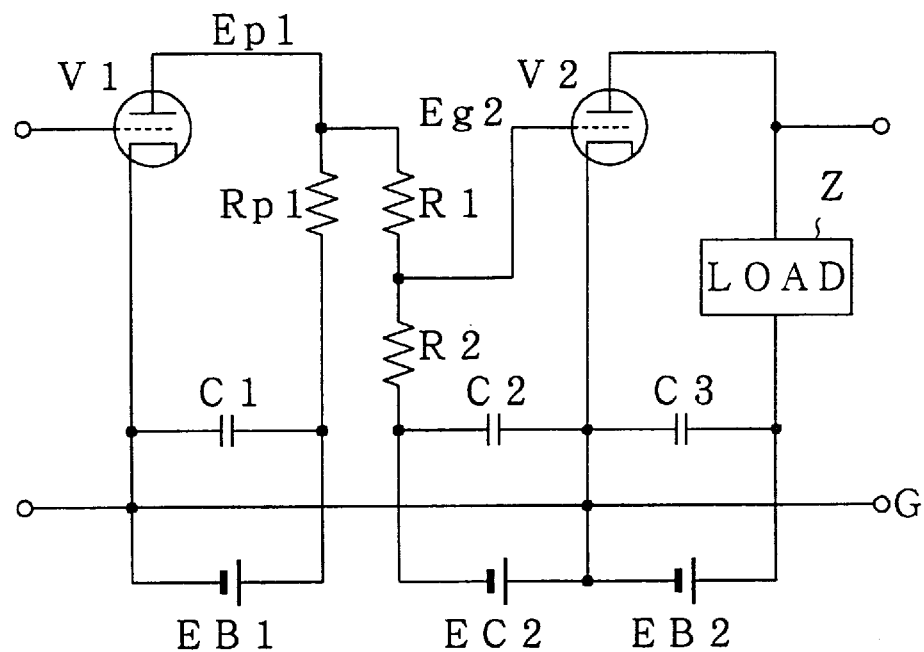
FIG. 1 is a circuit diagram showing a first example of a direct coupled amplifying circuit of a vacuum tube audio amplifying circuit according to a prior art.
Figure 2:
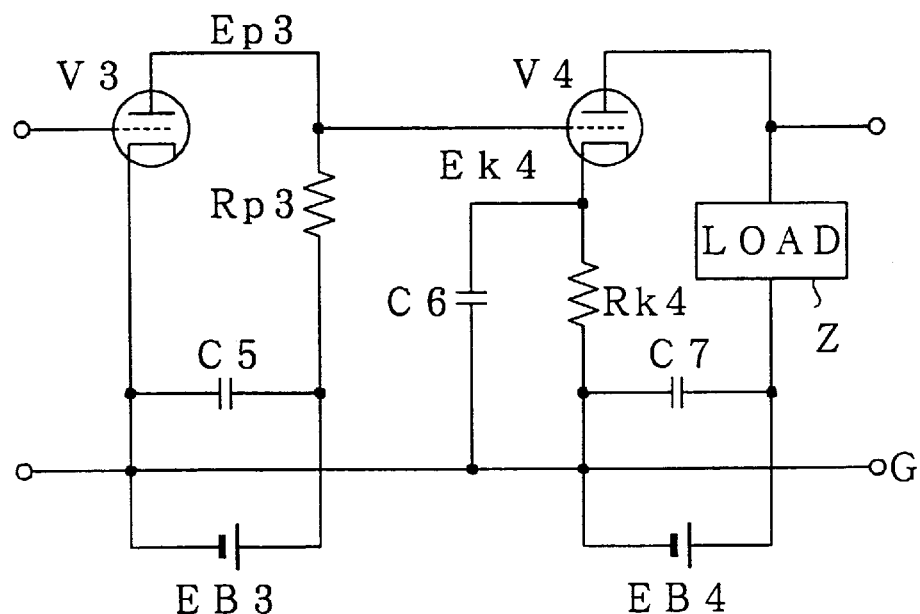
FIG. 2 is a circuit diagram showing a second example of a direct coupled amplifying circuit of a vacuum tube audio amplifying circuit according to a prior art.
Figure 3:
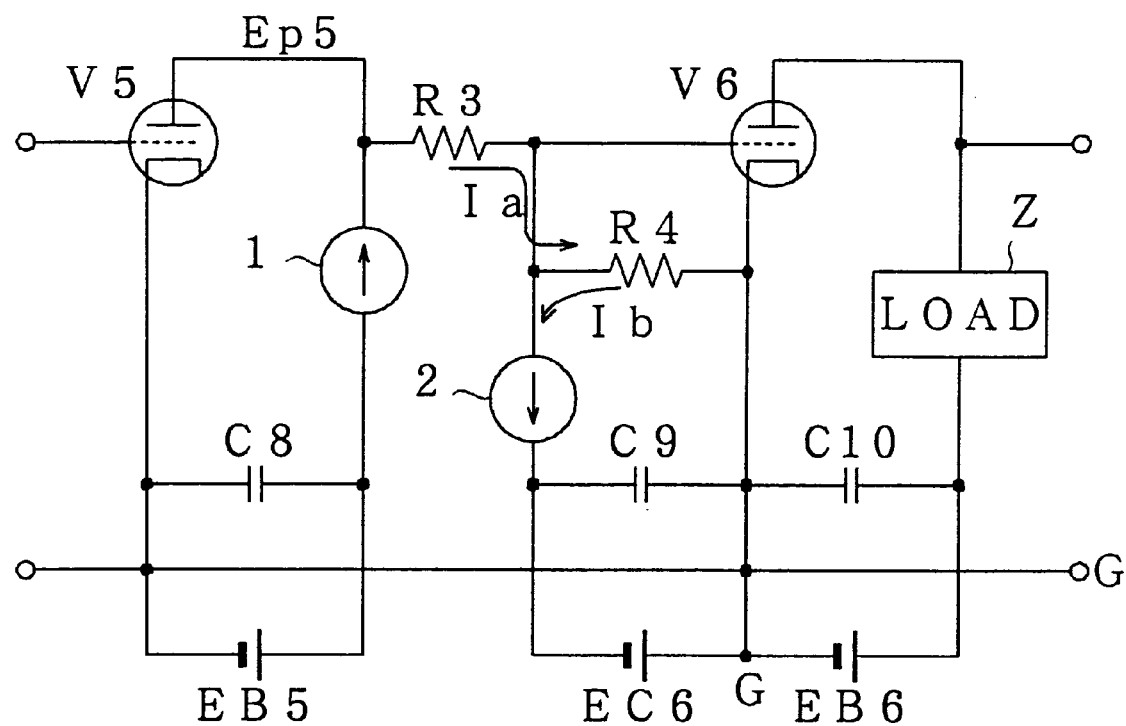
FIG. 3 is a circuit diagram of a vacuum tube audio amplifying circuit according to a first embodiment of the invention.

FIG. 3 is a circuit diagram of a vacuum tube audio amplifying circuit according to a first embodiment of the invention. This embodiment shows a direct coupled type two-stage amplifying circuit. In the diagram, a plate power source EB5 which is a first positive voltage source is connected to a plate of a vacuum tube V5 of a first stage through a first constant current circuit 1. To the plate of the vacuum tube V5, a grid of a vacuum tube V6 of a next stage is connected through a first resistance R3. A second resistance R4 is connected between the grid and a cathode of the vacuum tube V6. The cathode of the vacuum tube V6 is grounded. At the grid end of the vacuum tube V6, a negative voltage source EC6 is connected through a second constant current circuit 2. A plate power source EB6 which is a second positive voltage source is connected to a plate of the vacuum tube V6 through a load Z. Capacitors C8, C9 and C10 are decoupling capacitors connected parallel to the power sources EB5, EC6 and EB6, respectively. Instead of the power sources EB5 and EB6, a common power source may be also used.

In this constituted two-stage direct coupled amplifying circuit, an input voltage entered in the grid of the vacuum tube V5 of the first stage is amplified in voltage by a vacuum tube V5. The operating point of the vacuum tube V5 is determined by a grid bias voltage and the current value of the constant current circuit 1. Once this oparating point is determined, a plate voltage Ep5 of the vacuum tube V5 is determined, and hence the current value Ia flowing from the plate of the vacuum tube V5 to the ground through the resistances R3 and R4 is determined. This current value I$a$ is obtained in the following formula (3).

$$Ia = \frac{Ep5}{R3 + R4} \quad (3)$$

That is, the constant current of the constant current circuit 1 is divided into the plate current of the vacuum tube V5 and this current value Ia. In addition, a constant current of the constant current circuit 2 flows through the resistance R4 in a reverse direction of the current Ia. Therefore, a grid bias voltage Eg6 of the vacuum tube V6 is determined by the current value Ib of the constant current circuit 2, and is given in the following formula (4).

$$EG6 = (Ib - Ia) \pm + R4 \quad (4)$$

Herein, by equalizing the temperature characteristic of the active elements for composing the constant current circuits 1 and 2, since the currents Ia and Ib are mutually in reverse directions, variations of potential difference occurring between both ends of the resistance R4 due to current variations caused by temperature changes can be canceled mutually. It hence improves the stability against the temperature changes of the grid bias voltage of the vacuum tube V6. Even if the voltage of the plate voltage source EB5 fluctuates, the current Ia is not changed by the constant current circuit 1. Besides, since the direct-current load and alternating-current load of the vacuum tube V5 are separated, the plate voltage source EB5 is required to have only the sum of the plate voltage of the vacuum tube V5, the maximum signal output voltage required to be taken out, and the minimum voltage for starting the constant current operation of the constant current circuit 1. And therefore as compared with the conventional direct coupled amplifier, the voltage of the plate voltage source EB5 can be set lower. Moreover, when a triode is used in the vacuum tube V5, the distortion factor characteristic is improved when the alternating-current load impedance is larger. In this embodiment, the alternating-current load is determined by the series combined resistance of the resistances R3 and R4. Therefore, as compared with the conventional direct coupled circuit, while maintaining the degree of stability of the grid bias voltage of the vacuum tube V6 of the next stage, the alternating-current load can be set freely and much larger than in the prior art. Since the sound output signal of the vacuum tube V5 is fed back through the resistances R3 and R4, it is not fed back through the capacitor as mentioned in the prior art above. The sound signal is fed back from the plate of the vacuum tube V6 to the cathode through the load Z and capacitor C10, and is not fed back through the two capacitors C7 and C6 as experienced in the second prior art. Hence, not having the time constant or being small in the time constant, unnecessary fluctuations of frequency do not occur, and deterioration of sound quality can be substantially decreased.

Figure 4:
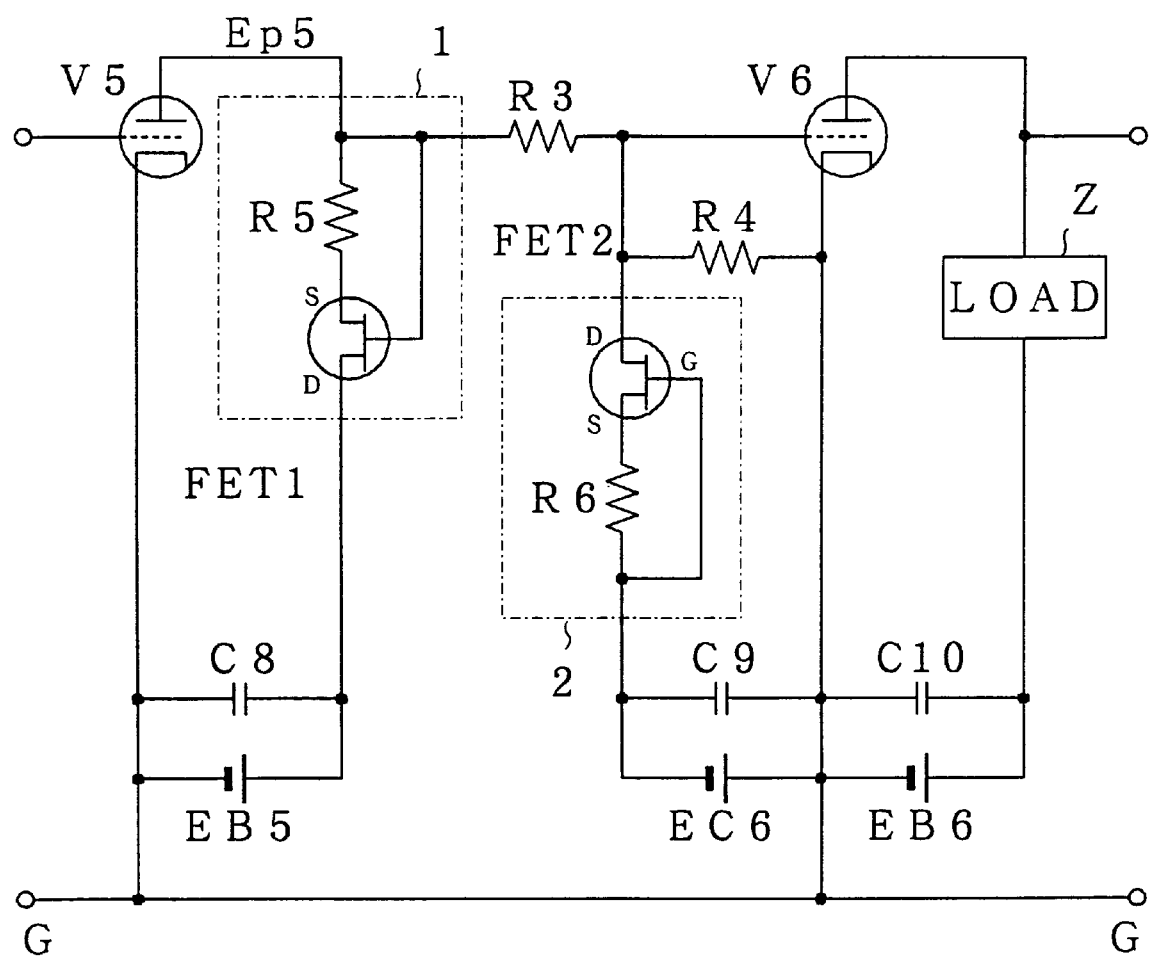
FIG. 4 is a more specific circuit diagram of the vacuum tube audio amplifying circuit according to the first embodiment of the invention.

FIG. 4 is a circuit diagram showing a specific circuit example composing the constant current circuits 1 and 2 by a field effect transistor 1, herein after referres to as FET1, and resistance R5, and by an FET2 and a resistance R6, respectively. The same parts as in the vacuum tube amplifying circuit in FIG. 3 are identified with same reference numerals and detailed description is omitted. In this constant current circuit 1, the resistance R5 is a resistance for current adjustment, and is connected between a source and gate of the FET1. A drain of the FET1 is connected to the plate power source EB5. In the constant current circuit 2 connected to the negative power source EC6, a drain of the FET2 is connected to the resistance R4, and the resistance R6 for current adjustment is connected to a source of the FET2. A gate of the FET2 and the other end of the resistance R6 are commonly connected and connected to the negative power source EC6. By constituting such constant current circuits 1 and 2, the current values can be selected freely by the values of the resistances R5 and R6 regardless of the characteristics of the FET1 and 2. In this case, by equalizing the temperature characteristics of the FET1, 2 as mentioned above, the grid bias voltage of the vacuum tube can be stabilized.

As described specifically herein, according to the embodiment, by directly coupling the vacuum tubes of the first and second stages to the plate circuit of the vacuum tube of the first stage and the grid circuit of the vacuum tube of the second stage connected thereto by using the constant current circuits, capacitors are not required in the coupled circuit. In this case, since the feedback loop of the alternating-current signal is simplified, the operation stability is high, and the sound quality can be improved. In addition, since the plate current is supplied into the vacuum tube through the first constant current circuit, fluctuations of the plate current are small, and the grid bias voltage can be stabilized. Still more, since the first constant current circuit is provided in the load of the first vacuum tube, the alternating-current load and direct-current load are separated, and the fluctuation width of the plate voltage can be decreased, and the alternating-current load can be set freely, and the characteristic about the sound signal can be improved. Moreover, since only one capacitor C10 is in the feedback loop of sound signal in the vacuum tube of the second stage can be decreased, the sound quality and frequency characteristic can be improved.

EMBODIMENT 2

Figure 5:
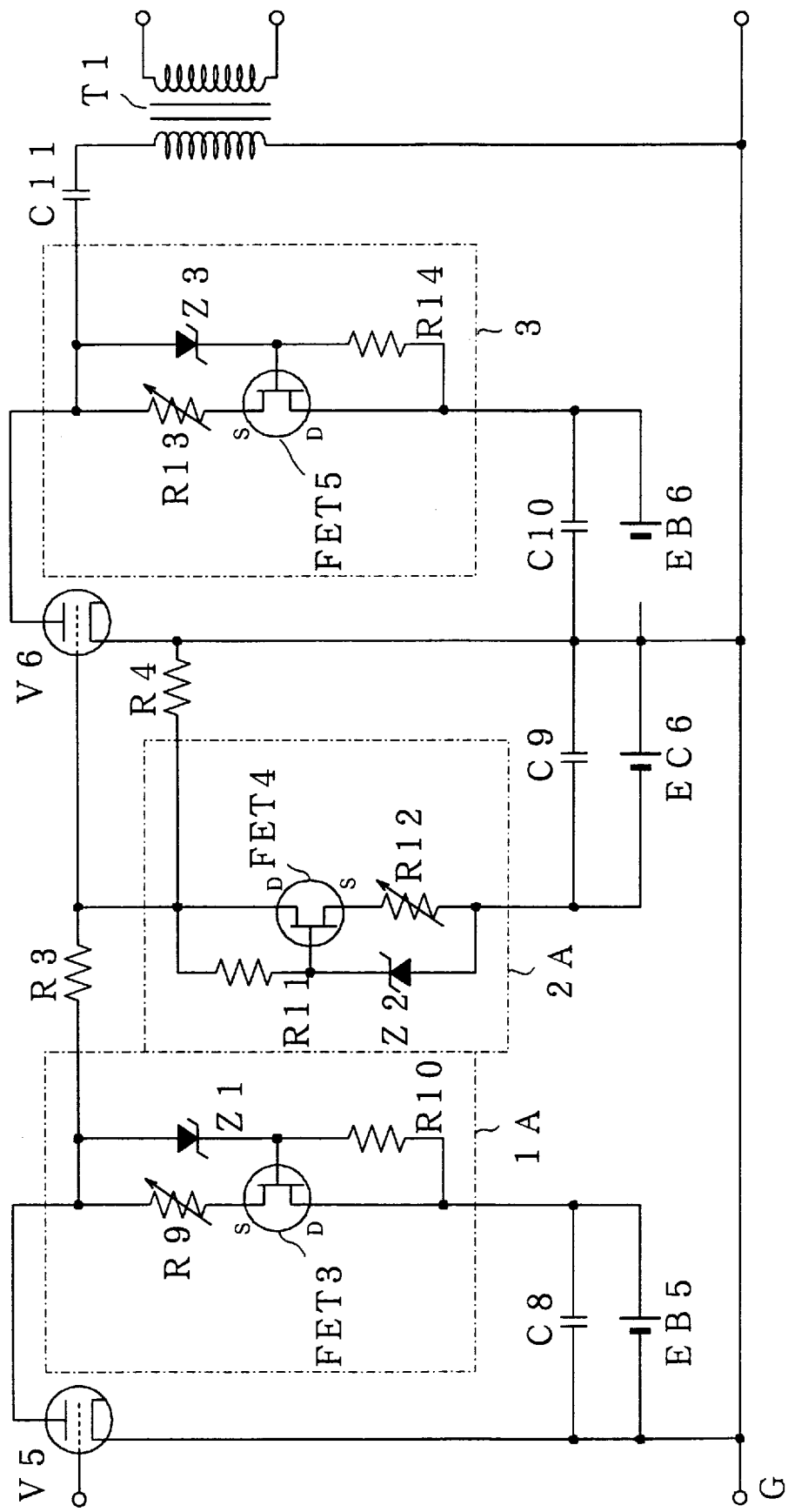
FIG. 5 is a circuit diagram of a vacuum tube audio amplifying circuit according to a second embodiment of the invention.

FIG. 5 is a specific circuit diagram of a vacuum tube amplifying circuit for sound according to a second embodiment. This embodiment is nearly same as the first embodiment in the constitution of the input side of the vacuum tubes V5 and V6, and a constant current circuit 3 and an output transformer T1 are provided at the output side. Same parts as in the first embodiment are identified with same reference numerals. In the diagram, a constant current circuit 1A is composed of a FET3, a variable resistor R9, a constant voltage element such as Zener diode Z1, and a resistance R10. The variable resistor R9 for current adjustment is connected in series to a source of the FET3, and the Zener diode Z1 and resistance R10 in series are connected parallel thereto. A gate of the FET3 is connected to the middle point of the series. Similarly, a second constant current circuit 2A is composed of an FET4, a resistance R11, a variable resistor R12, and a constant voltage element such as Zener diode Z2. The variable resistor R12 for current adjustment is connected in series to the FET4, and the resistance R11 and Zener diode Z2 in series are connected parallel thereto. A gate of the FET4 is connected to the middle point. According to such constitution, the constant current characteristic of the constant current circuits can be enhanced. Incidentally, instead of the Zener diodes used herein as the constant voltage elements, lithium cells or other small batteries may be used.

In the embodiment, the plate power source EBB which is a second positive voltage source is connected to the plate of the vacuum tube V6 through the third constant current circuit 3. In this constant current circuit 3, too, a resistance R13 are connected in series to the source of an FET5, and a series circuit of a constant voltage element such as Zener diode Z3 and a resistance R14 is connected parallel thereto. A gate of the FET5 is connected to the middle point of the Zener diode Z3 and resistance R14. To the plate of the vacuum tube V6, one end of a primary side of the output transformer T1 is connected through a coupling capacitor C11. The other end of the primary side of the output transformer T1 is grounded, and a load such as a speaker, not shown, is connected to a secondary side. In this case, a loop is formed from the plate of the vacuum tube V6 to the cathode through the coupling capacitor C11 and primary side of the output transformer T1. However, since the constant current circuit 3 is extremely high in impedance to the sound signal, a loop from the constant current circuit 3 to the cathode is not formed. Therefore, there is a single feedback loop of sound signal, and the sound quality hardly deteriorates. In the output transformer T1, moreover, the direct current flowing into the primary winding is cut off by the coupling capacitor C11. Hence, direct-current magnetization of the output transformer T1 is prevented, and a sufficient inductance can be assured, so that the low range frequency characteristic can be substantially improved. Moreover, since there is no heat loss due to direct current in the output transformer T1, the size can be reduced from the conventional output transformer when picking up a same sound output, so that an output transformer of high efficiency can be designed. The constant current circuit 3 may also be composed of an FET and a resistance only same as shown in FIG. 4.

Herein, supposing the plate voltage EB5 of the vacuum tube V6 to be 200 V, the resistances R3 and R4 to be individually 50 kohms, and the required grid bias voltage Eg6 of the vacuum tube V6 to be −50 V, the current Ia flowing from the plate of the vacuum tube V5 through the resistance R3 and R4 is 2 mA according to formula (3).

Therefore, by properly selecting the resistance value of the variable resistor R12 of the constant current circuit 2A and passing the current Ib given in the formula below into the constant current circuit 2 from the cathode of the vacuum tube V6 through the resistance R4, the grid bias voltage Eg6 of the vacuum tube V6 may be set to −50 V.

$$Ib = \frac{Eg6}{R4} - Ia = -3 \text{ mA}$$

EMBODIMENT 3

Figure 6:
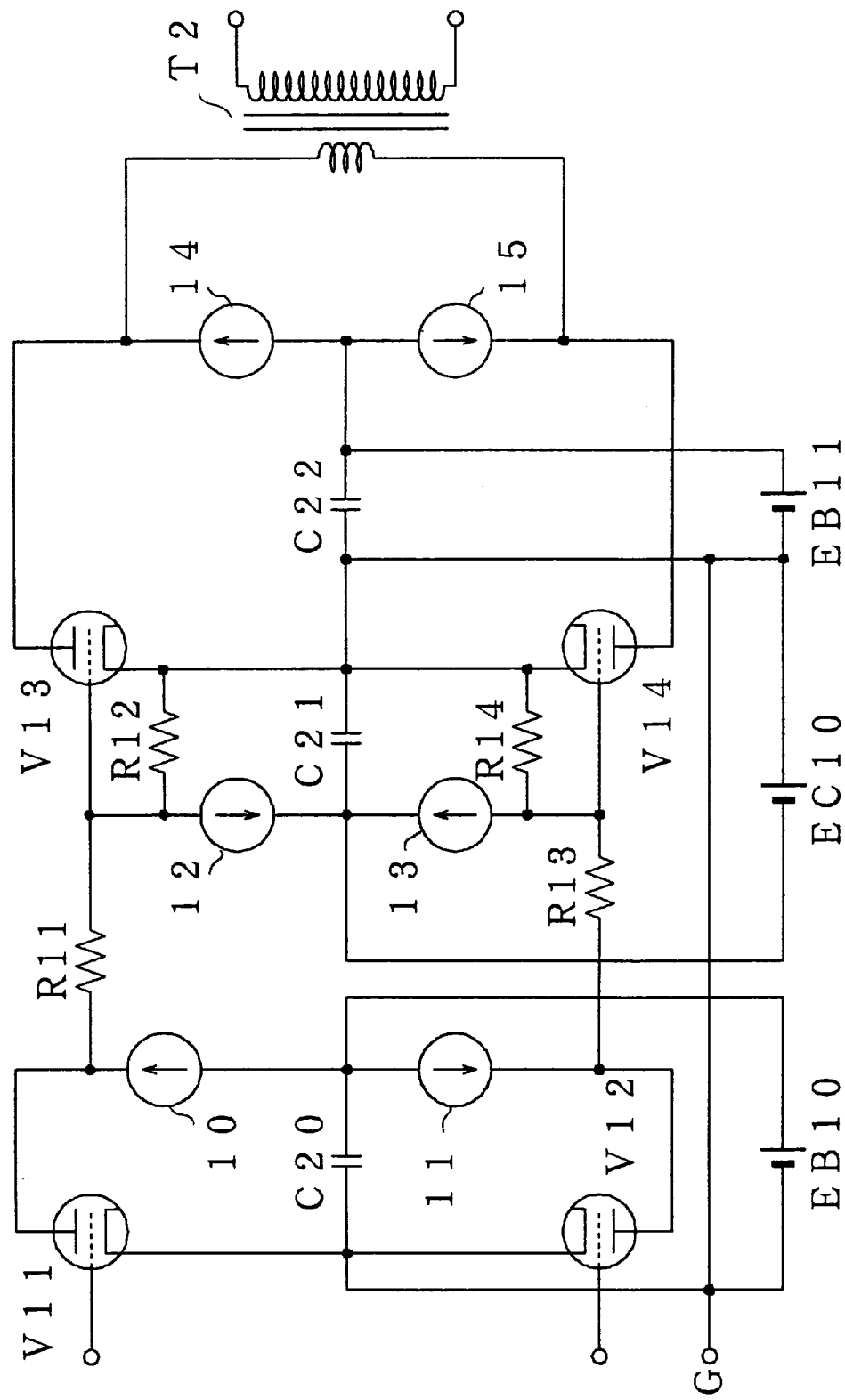
FIG. 6 is a circuit diagram showing an example of a vacuum tube audio amplifying circuit according to a third embodiment of the invention.

FIG. 6 is a circuit diagram of a vacuum tube audio amplifying circuit according to a third embodiment of the invention In the vacuum tube amplifying circuit of the embodiments the amplifying circuit in the second embodiment is applied in a push-pull type amplifying circuit. In FIG. 6, a pair of vacuum tubes V11, V12 are vacuum tubes of a first stage connected symmetrically to their cathodes, with their cathodes commonly connected. Input voltages of different polarities are supplied into the grids of the vacuum tubes V11 and V12. A plate power source EB10 which is a positive voltage source is connected to plates of the vacuum tubes V11 and V12 through first constant current circuits 10 and 11, respectively. The positive pole end of the plate power source EB10 is grounded through a decoupling capacitor C20. A plate of the vacuum tube V11 is connected to a grid of a vacuum tube V13 through a resistance R11. A plate of the vacuum tube V12 is connected to a grid of a vacuum tube V14 through a resistance R13. A pair of vacuum tubes V13 and V14 are vacuum tubes of a second stage connected symmetrically by commonly connecting their cathode electrodes. A resistance R12 is connected between the grid and a cathode of the vacuum tube V13. A resistance R14 is connected between the grid and a cathode of the vacuum tube V14. A negative electrode end of a negative power source EC10 is connected to a common connection end of the resistances R11 and R12 and a common connection end of R13 and R14, respectively, through constant current circuits 12 and 13. A plate power source EB11 which is a second positive voltage source is connected to the plates of the vacuum tubes V13 and V14 through constant current circuits 14 and 15, respectively. These plates are respectively connected to each end of the primary side winding of an output transformer T2. A load such as speaker, not shown, is connected to the secondary side of the output transformer T2.

In this case, to match the operating of the vacuum tubes V13 and V14, it is designed to adjust the current value of the constant current sources 12 and 13 for adjusting the grid bias voltage. By equalizing the current values of the constant current sources 14 and 15, the direct current flowing in the primary side of the transformer T2 may be eliminated. As a result, there is no direct-current magnetization of the transformer T2. In this case, by separating the constant current circuits 14 and 15 which are direct-current loads of the vacuum tubes V13 and V14 of the final stage, heat generation is decrease from the output transformer T2 which is an alternating-current load. The heat generation is also decreased because direct current does not flow, and the core of the transformer T2 may be of a smaller size than in the conventional push-pull type power amplifying circuit, and a small-size output transformer T2 may be used, which is an excellent effect.

According to the embodiment, the alternating-current load and direct-current load are separated, and heat generation can be decreased. Moreover, by equalizing the plate currents of the two vacuum tubes of the second stage, direct current does not flow into the output transformer, so that direct-current magnetization does not occur.

EMBODIMENT 4

Figure 7:
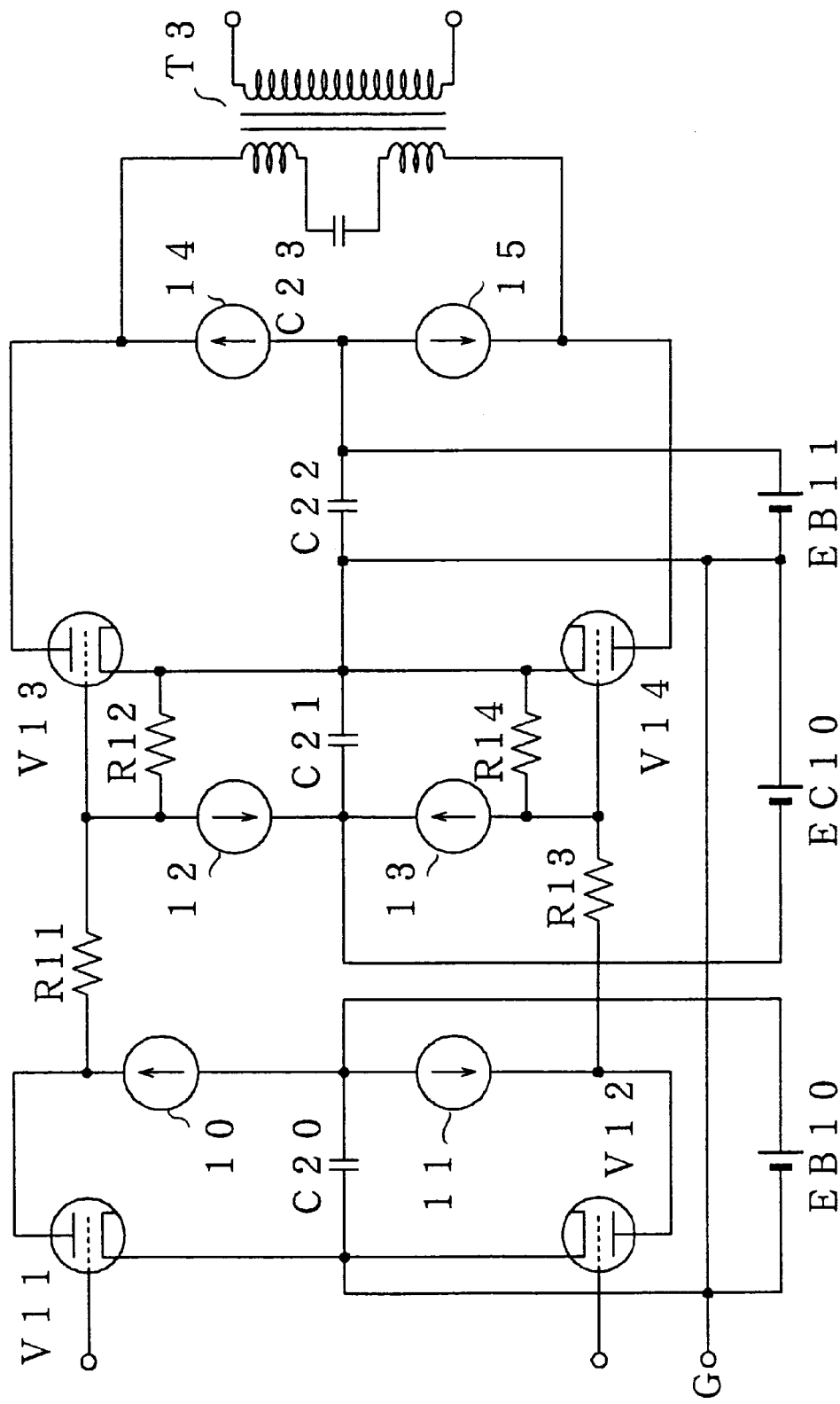
FIG. 7 is a circuit diagram showing an example of a vacuum tube audio amplifying circuit according to a fourth embodiment of the invention.

FIG. 7 is a circuit diagram of a vacuum tube amplifying circuit for sound according to a fourth embodiment. This embodiment is intended to facilitate balance adjustment of plate direct current of the amplifying circuit in the third embodiment. In the diagram, same parts are identified with same reference numerals, and detailed description is omitted. In this embodiment, an output transformer T3 is a push-pull type transformer having two symmetrical windings at the primary side, and plates of vacuum tubes V13, V14 are connected to each end of the primary side windings. The other ends of the primary side windings are connected to a capacitor C23 for cutting off the direct current. The other constitution is same as in the third embodiment. In this case, if the plate currents of the vacuum tubes V13 and V14 are imbalanced due to time course changes or the like, since direct current through the primary windings of the output transformer T3 is cut off by the capacitor C23, direct-current magnetization can be eliminated.

In this embodiment, since the primary side of the output transformer T3 is cut off by the capacitor, direct current does not leak. Therefore, without having to consider the direct-current balance, effects of direct-current magnetization can be eliminated. It hence brings about an excellent effect that an output transformer of a smaller size than in the conventional push-pull amplifying circuit can be used.

Figure 8:
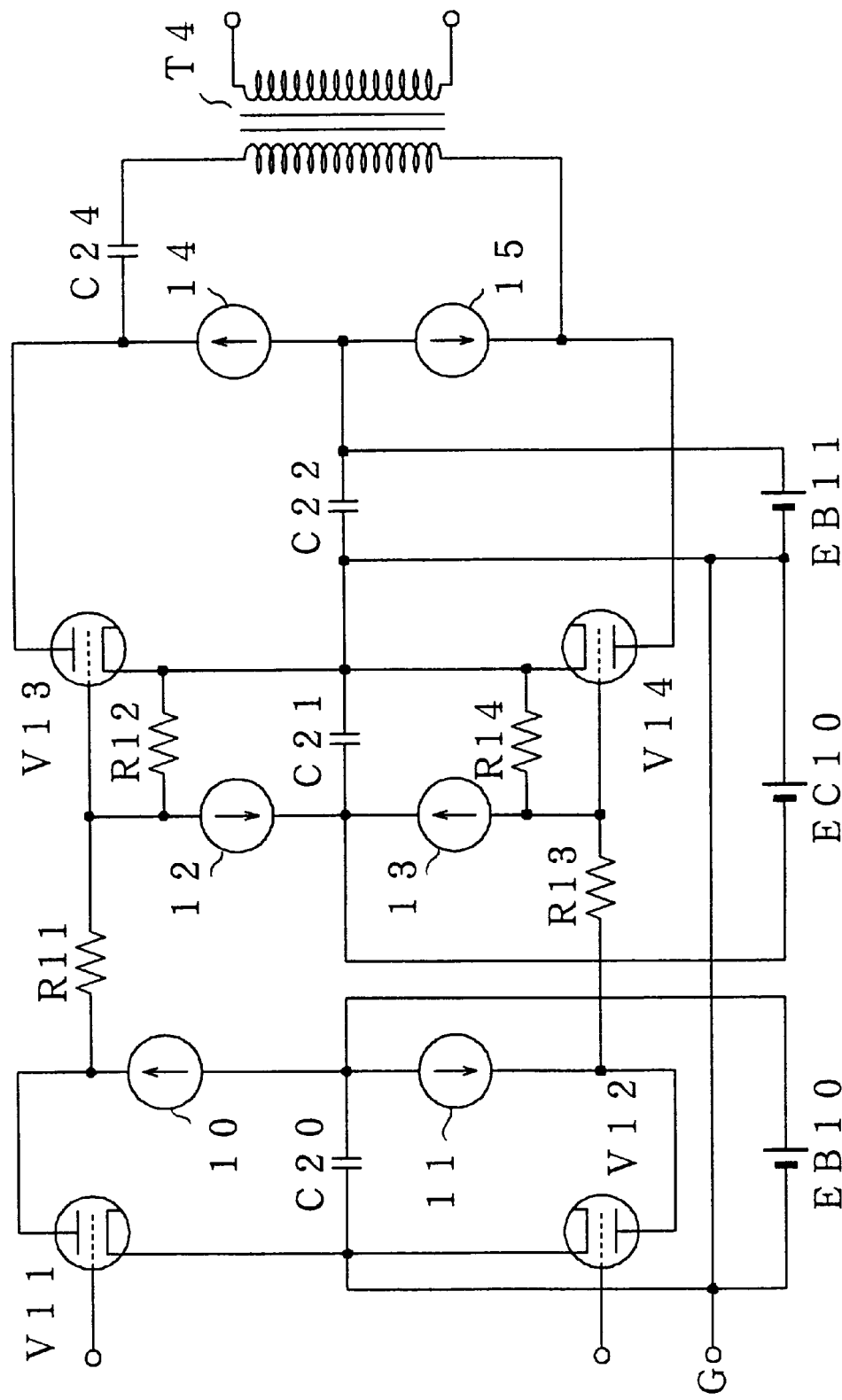
FIG. 8 is a circuit diagram showing other example of the vacuum tube audio amplifying circuit according to the fourth embodiment of the invention.

FIG. 8 is a circuit diagram showing other example of this push-pull type power amplifying circuit. In the diagram, same parts are identified with same reference numerals and detailed description is omitted. In this embodiment, when using an output transformer T4 having no center tap in the output portion, one end of the primary side of the output transformer T4 is connected to the plate of one vacuum tube V13 through a capacitor C24 for cutting off direct current. At the other end of the primary side, the plate of the vacuum tube V14 is connected directly. The other constitution is same as in the amplifying circuit in FIG. 7. In this case, too, the same effect as in the amplifying circuit in the third embodiment is obtained.

What I claim is:

1. A vacuum tube audio amplifying circuit comprising:
    a first vacuum tube of a first stage for receiving a sound input signal at a grid thereof;
    a second vacuum tube of a second stage for amplifying an amplified output of said first vacuum tube;
    a first positive voltage source;
    a first constant current circuit connected between an output end of said first positive voltage source and a plate of said first vacuum tube, for supplying a specific current;
    a first resistance connected between the plate of said first vacuum tube and a grid of said second vacuum tube;
    a negative voltage source for supplying a negative voltage to the grid of said second vacuum tube;
    a second constant current circuit connected between an output end of said negative voltage source and the grid of said second vacuum tube, for supplying a specific current;
    a second resistance connected between said grid and the cathode of said second vacuum tube; and
    a second positive voltage source connected to the plate of said second vacuum tube of through a load;
    wherein a grid bias voltage of said vacuum tube is set according to a voltage drop obtained at both ends of said second resistance on the basis of the shunt current of said first constant current circuit flowing in said second resistance and the current of said second constant current circuit.

2. A vacuum tube audio amplifying circuit according to claim 1, further comprising a third constant current circuit connected between the output end of said second positive voltage source and the plate of said second vacuum tube, for supplying a specific current.

3. A vacuum tube audio amplifying circuit comprising:
    vacuum tubes of a first stage, being a pair of vacuum tubes connected symmetrically to each other with common cathode electrode, for receiving input signals of different polarities at grids of said pair of vacuum tubes;
    vacuum tubes of a second stage, being a pair of vacuum tubes connected symmetrically to each other with common cathode electrode, for amplifying the amplified outputs of said vacuum tubes of the first stage;
    a first positive voltage source;
    two first constant current circuits connected between an output end of said first positive voltage source and plates of said vacuum tubes of the first stage, for supplying specific currents;

two first resistances connected respectively between plates of said vacuum tubes of the first stage and grids of said vacuum tubes of the second stage;

a negative voltage source for supplying a negative voltage to grids of said vacuum tubes of the second stage;

two second constant current circuits connected between an output end of said negative voltage source and grids of said vacuum tubes of the second stage, for supplying specific currents;

two second resistances connected respectively between grids and cathodes of said vacuum tubes of the second stage;

an output transformer having its primary side winding connected between plates of said pair of vacuum tubes of the second stage; and a second positive power source connected to plates of said pair of vacuum tubes of the second stage.

4. A vacuum tube audio amplifying circuit according to claim 3, further comprising two third constant current circuits connected between an output end of said second positive voltage source and plates of said vacuum tubes of second stage, for supplying specific currents.

5. A vacuum tube audio amplifying circuit according to claim 3, wherein said primary winding of said output transformer is connected between plates of said pair of vacuum tubes of the second stage through a capacitor for cutting off direct current.

6. A vacuum tube audio amplifying circuit according claim 3, wherein said primary winding of said output transformer has two symmetrical windings;

said vacuum tubes of said second stage have their plates connected respectively to each end of said two primary windings;

and a capacitor for cutting off direct current is connected between the other ends of the primary windings.

7. A vacuum tube audio amplifying circuit according to claim 1, wherein said first and second constant current circuits include a field effect transistor, and a current adjusting resistance for defining the constant current by its resistance value as being connected between a source and a gate of said field effect transistor.

8. A vacuum tube audio amplifying circuit according to claim 3, wherein said first and second constant current circuits include a field effect transistor, and a current adjusting resistance for defining the constant current by its resistance value as being connected between a source and a gate of said field effect transistor.

9. A vacuum tube audio amplifying circuit according to claim 1, wherein each of said first and second constant current circuit includes a field effect transistor, a variable resistance connected to a source of said field effect transistor, a constant voltage element connected to other end of said variable resistance and a gate of said field effect transistor, and a fixed resistance connected between the gate and a drain of said field effect transistor.

10. A vacuum tube audio amplifying circuit according to claim 3, wherein each of said first and second constant current circuit includes a field effect transistor, a variable resistance connected to a source of said field effect transistor, a constant voltage element connected to other end of said variable resistance and a gate of said field effect transistor, and a fixed resistance connected between the gate and a drain of said field effect transistor.

11. A vacuum tube audio amplifying circuit according to claim 9, wherein said constant voltage element is a Zener diode.

12. A vacuum tube audio amplifying circuit according to claim 10, wherein said constant voltage element is a Zener diode.

13. A vacuum tube audio amplifying circuit according to claim 2, wherein said third constant current circuit includes a field effect transistor, and a current adjusting resistance for defining the constant current by its resistance value as being connected between the source and gate of said a field effect transistor.

14. A vacuum tube audio amplifying circuit according to claim 4, wherein each of said third constant current circuit includes a field effect transistor, and a current adjusting resistance for defining the constant current by its resistance value as being connected between a source and a gate of said field effect transistor.

15. A vacuum tube amplifying circuit according to claim 2, wherein each of said third constant current circuit includes a field effect transistor, a variable resistance connected to a source of said field effect transistor, a constant voltage element connected to other end of said variable resistance and a gate of said field effect transistor, and a fixed resistance connected between a gate and a drain of said field effect transistor.

16. A vacuum tube amplifying circuit according to claim 4, wherein said third constant current circuit includes a field effect transistor, a variable resistance connected to the source of said field effect transistor, a constant voltage element connected to other end of said variable resistance and a gate of said field effect transistor, and a fixed resistance connected between the gate and a drain of said field effect transistor.

17. A vacuum tube audio amplifying circuit according to claim 15, wherein said constant voltage element is a Zener diode.

18. A vacuum tube audio amplifying circuit according to claim 16, wherein said constant voltage element is a Zener diode.

* * * * *